US009599890B2

(12) United States Patent
Navarro et al.

(10) Patent No.: US 9,599,890 B2
(45) Date of Patent: Mar. 21, 2017

(54) METHOD FOR MANUFACTURING A NANOLITHOGRAPHY MASK

(71) Applicants: ARKEMA FRANCE, Colombes (FR);
COMMISSARIAT A L'ENERGIE ATOMIQUE ET AUX ENERGIES ALTERNATIVES, Paris (FR)

(72) Inventors: Christophe Navarro, Bayonne (FR);
Maxime Argoud, Saint Clair de la Tour (FR); Xavier Chevalier, Grenoble (FR); Raluca Tiron, Saint-Martin-le-Vinoux (FR); Ahmed Gharbi, Grenoble (FR)

(73) Assignees: ARKEMA FRANCE, Colombes (FR);
COMMISSARIAT A L' ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/654,277

(22) PCT Filed: Dec. 16, 2013

(86) PCT No.: PCT/FR2013/053102
§ 371 (c)(1),
(2) Date: Jun. 19, 2015

(87) PCT Pub. No.: WO2014/096662
PCT Pub. Date: Jun. 26, 2014

(65) Prior Publication Data
US 2015/0331313 A1  Nov. 19, 2015

(30) Foreign Application Priority Data
Dec. 21, 2012 (FR) ..................... 12 62610

(51) Int. Cl.
*G03F 7/004* (2006.01)
*G03F 1/76* (2012.01)
(Continued)

(52) U.S. Cl.
CPC ............... *G03F 1/76* (2013.01); *B82Y 30/00* (2013.01); *C08L 53/00* (2013.01); *G03F 1/00* (2013.01);
(Continued)

(58) Field of Classification Search
CPC .......... C08L 53/00; G03F 1/76; G03F 7/0002; G03F 7/325; G03F 7/331; H01L 21/0271; H01L 21/0274; B82Y 30/00
(Continued)

(56) References Cited

U.S. PATENT DOCUMENTS 6,565,763 B1  5/2003 Asakawa
7,071,047 B1  7/2006 Furukawa
(Continued)

FOREIGN PATENT DOCUMENTS

WO  2011094597  8/2011

OTHER PUBLICATIONS

Asakawa, K. et al., "Nanopatterning with Microdomains of Block Copolymers Using Reactive-Ion Etching Selectivity," Japanese Journal of Applied Physics, vol. 41, No. 10, Part 01, Oct. 2002, pp. 6112-6118n.
(Continued)

*Primary Examiner* — Amanda C Walke
(74) *Attorney, Agent, or Firm* — RatnerPrestia

(57) ABSTRACT

The invention concerns a manufacturing method for nanolithography masks from a PS-b-PMMA block copolymer film deposited on a surface to be etched, said copolymer film comprising PMMA nanodomains orientated perpendicularly
(Continued)

to the surface to be etched, said method being characterized in that it comprises the following steps:
partially irradiating said copolymer film to form a first irradiated area and a second non-irradiated area in said copolymer film, then
treating said copolymer film in a developer solvent to selectively remove at least said PMMA nanodomains of said first irradiated area of said copolymer film.

21 Claims, 7 Drawing Sheets

(51) Int. Cl.
| | | |
|---|---|---|
| *G03F 1/00* | (2012.01) | |
| *B82Y 30/00* | (2011.01) | |
| *H01L 21/027* | (2006.01) | |
| *C08L 53/00* | (2006.01) | |
| *G03F 7/00* | (2006.01) | |
| *G03F 7/32* | (2006.01) | |

(52) U.S. Cl.
CPC ............ *G03F 7/0002* (2013.01); *G03F 7/325* (2013.01); *H01L 21/0274* (2013.01)

(58) Field of Classification Search
USPC ..................................................... 430/5, 331
See application file for complete search history.

(56) References Cited

U.S. PATENT DOCUMENTS

| | | | | |
|---|---|---|---|---|
| 8,993,221 B2* | 3/2015 | Cooper | ................... | G03F 7/004 430/311 |
| 9,012,317 B2* | 4/2015 | Chen | ................... | H01L 29/7881 257/316 |
| 9,012,882 B2* | 4/2015 | Duan | ..................... | B82Y 30/00 257/77 |
| 2002/0158342 A1 | 10/2002 | Tuominen | | |
| 2006/0228653 A1 | 10/2006 | Colburn | | |
| 2009/0240001 A1 | 9/2009 | Regner | | |
| 2011/0081777 A1* | 4/2011 | Yoon | ................... | H01L 21/0337 438/674 |
| 2012/0116007 A1 | 5/2012 | Gopalan | | |
| 2012/0208127 A1 | 8/2012 | Hatakeyama | | |
| 2013/0313223 A1 | 11/2013 | Fujikawa | | |

OTHER PUBLICATIONS

Kim, H. et al., "Block Copolymer Based Nanostructures: Materials, Processes, and Applications to Electronics", Chemical reviews, vol. 110, No. 1, p. 146-177.

Liu, C. et al., "Pattern transfer using poly(styrene-block-methyl methacrylate) copolymer films and reactive ion etching," Journal of Vacuum Science Technology B: Microelectronics and Nanometer Structures, vol. 25, No. 6, p. 1963-1968, 2007.

Hansen, Charles, "Hansen Solubility Parameters: A user's handbook", Second Edition (2007) Boca Raton, FL: CRC Press. ISBN 978-0-8493-7248-3.

International Search Report for International Application No. PCT/FR2013/053102 mailed Mar. 5, 2014.

Kingsborough, R. et al., "Lithographically directed materials assembly", Proc of SPIE, vol. 7271, 2009, p. 72712D-72712D-10.

Thurn-Albrecht, T. et al., "Nanoscopic Templates from Oriented Block Copolymer Films", Advanced Materials, vol. 12, No. 11, p. 787-791, 2000.

Written Opinion of the International Searching Authority for International Application No. PCT/FR2013/053102 mailed Mar. 5, 2014.

Written Opinion for Singapore Application No. 11201504292Q, dated May 12, 2016, 7 pages.

* cited by examiner

| solvent N° | N° 1 (G1) | N° 13 (G2) | N° 15 (G5) | N° 12 (G3) |
|---|---|---|---|---|
| |  |  |  |  |
| | 200 µC.cm$^{-2}$ | 1000 µC.cm$^{-2}$ | 1000 µC.cm$^{-2}$ | 200 µC.cm$^{-2}$ |

| solvent N° | N° 18 (G4) | N° 13 (G2) | N° 35 (G5) | N° 1 (G1) |
|---|---|---|---|---|
| Hydrogen E~3kev ~2.10$^{15}$cm$^{-2}$ |  |  |  |  |
| Hydrogen E~3kev ~1-2.10$^{14}$cm$^{-2}$ |  |  |  |  |
| Oxygen E~8kev ~3.10$^{12}$-10$^{13}$ cm$^{-2}$ |  |  |  | |

| Solvent | N°3 (G1) | N°3 (G1) |
|---|---|---|
| T°C | 25°C | 40°C |
| |  |  |

| Solvent | N°20 (G3) | N°20 (G3) |
|---|---|---|
| T°C | 25°C | 40°C |
| |  |  |

| Solvent | N°18 (G4) | N°18 (G4) |
|---|---|---|
| UV | 300mJ/cm² | 300mJ/cm² |
| T°C | 25°C | 15°C |
| |  |  |

METHOD FOR MANUFACTURING A NANOLITHOGRAPHY MASK

CROSS-REFERENCE TO RELATED APPLICATIONS

This is a national phase of International Application No. PCT/FR2013/053102, filed Dec. 16, 2013, which claims priority from French Application No. 1262610, filed Dec. 21, 2012. The disclosures of each of these applications are incorporated herein by reference in their entirety for all purposes.

FIELD OF THE INVENTION

The present invention concerns the field of nanolithography.

More particularly, the invention relates to a manufacturing method for nanolithography masks, as well as to a developer solvent used in the design of such masks and a PS-b-PMMA block copolymer intended to be used in the design of nanolithography masks.

DISCUSSION OF RELATED ART

The development of nanotechnologies has enabled ongoing miniaturization of products from the microelectronics field and microelectromechanical systems (MEMS) in particular. To meet ongoing miniaturization needs, it was necessary to adapt lithography techniques and create etching masks that enable increasingly smaller patterns to be created with high resolution.

Among the masks studied to carry out nanolithography, block copolymer films, especially based on polystyrene-poly (methylmethacrylate), designated PS-b-PMMA below, appear to be very promising solutions since they allow creating patterns with a high resolution. To be able to use such a block copolymer film as an etching mask, a block of the copolymer must be selectively removed to create a porous film from the residual block, whose patterns can later be transferred by etching to an underlying layer. For PS-b-PMMA film, the minority block, i.e., PMMA (poly(methyl methacrylate)), is removed selectively to create a residual PS (polystyrene) mask. Creating such masks from a PS-b-PMMA block copolymer film is particularly described in publications entitled "Block Copolymer Based Nanostructures: Materials, Processes, and Applications to Electronics", by H.-C. Kim, S.-M. Park, and W. D. Hinsberg, *Chemical reviews*, vol. 110, no. 1, p. 146-177; and "Lithographically directed materials assembly", by R. P. Kingsborough, R. B. Goodman, K. Krohn, and T. H. Fedynyshyn, 2009, p. 72712D-72712D-10.

The selective removal of the PMMA block is generally done by dry or wet etching. Dry etching was especially described in the publication entitled "Pattern transfer using poly(styrene-block-methyl methacrylate) copolymer films and reactive ion etching", by C.-C. Liu, P. F. Nealey, Y.-H. Ting, and A. E. Wendt, *Journal of Vacuum Science Technology B: Microelectronics and Nanometer Structures*, vol. 25, no. 6, p. 1963-1968, November 2007. An oxygen, $O_2$, plasma is preferred for this type of etching. However, a poor etching selectivity between PS and PMMA limits the thickness of the residual film. It therefore appears difficult to create masks with high resolution patterns using dry etching.

In contrast, wet etching appears better to create masks with high resolution patterns. Exposing the entire block copolymer film to ultraviolet (UV) radiation, followed by treating with acetic acid or TMAH (tetramethylammonium hydroxide), leads to a PS matrix with a thicker film. The mask thus obtained allows transferring patterns, by chemical etching, to an underlying substrate with high resolution, a large form factor and low roughness. Such wet etching is described, for example, in the publication entitled "Nanoscopic Templates from Oriented Block Copolymer Films", by T. Thurn-Albrecht, R. Steiner, J. DeRouchey, C. M. Stafford, E. Huang, M. Bal, M. Tuominen, C. J. Hawker, and T. P. Russell, *Advanced Materials*, vol. 12, no. 11, p. 787-791, 2000.

SUMMARY OF THE INVENTION

However, although we now know how to selectively remove the PMMA blocks from an irradiated PS-PMMA block copolymer to obtain a residual PS film usable as a nanolithography mask, the application has observed that this mask remains limited, since it does not permit creating several different and localized patterns to be transferred.

The invention thus aims to remedy at least one of the disadvantages of the prior art. The invention especially aims to design nanolithography masks, said masks being based on PS-b-PMMA block copolymers, by selectively removing different blocks from the block copolymer so as to create different patterns on the same mask with high resolution, located in different places on the mask.

The solution proposed by the present invention responds to all these criteria and permits designing dedicated masks for block copolymers in which areas are locally defined to create different patterns.

To this end, the invention relates to a manufacturing method for nanolithography masks from a PS-b-PMMA block copolymer film deposited on a surface to be etched, said copolymer film comprising PMMA nanodomains orientated perpendicularly to the surface to be etched, said process being characterized in that it comprises the following steps:

partially irradiating said copolymer film to form a first irradiated area and a second non-irradiated area in said copolymer film, then treating the copolymer film in a developer solvent to selectively remove at least said PMMA nanodomains of said first irradiated area of said copolymer film.

Thus, the fact of partially irradiating the copolymer film allows creating irradiated and non-irradiated areas that have different contrasts, in which the PS and PMMA blocks have different solubility properties. Partially irradiating the film and creating irradiated and non-irradiated areas allows selectively removing one or more irradiated and/or non-irradiated blocks from the film, depending on the developer solvent used. The selective removal of different copolymer blocks, depending on whether or not these blocks are irradiated, then creates different patterns located at different places on the same mask.

Advantageously, when the treatment step consists of selectively removing said PMMA nanodomains from said first irradiated area of said copolymer film, the developer solvent is chosen from a group of solvents or solvent mixtures that includes at least one compound chosen from among alcohols, such as methanol, ethanol, isopropyl alcohol, butan-1-ol, octan-1-ol, (R,S)-octan-2-ol, 4-methyl-2-pentanol, or 2-ethylhexanol.

In another particular embodiment of the invention, the treatment step consists of also selectively and partially removing said PMMA nanodomains from said second non-irradiated area of said copolymer film so as to form holes whose diameter is less than the diameter of the holes left by the removal of the PMMA nanodomains from said first irradiated area. In this case, the developer solvent is chosen from a group of solvents or solvent mixtures that includes at least one compound chosen from among: acetic acid, acetonitrile or dimethylsulfoxide.

More particularly, the developer solvent is chosen from among solvents or solvent mixtures having Hansen solubility parameters, calculated at 25° C., comprised within the following value ranges: $14.5 \leq \delta_D \leq 19.00$; $4.90 \leq \delta_P \leq 18.00$ and $5.10 \leq \delta_H \leq 15.26$.

Thus, all the solvents or solvent mixtures whose Hansen parameters, calculated at 25° C., are comprised in these value ranges have a similar behavior with regard to a PS-b-PMMA block copolymer film.

According to another particular embodiment of the invention, the treatment step in said developer solvent consists of also removing said second non-irradiated area of said copolymer film and the developer solvent is chosen from a group of solvents or solvent mixtures that includes at least one compound chosen from among: ketones, such as acetone or pentan-2-one; amides such as N,N-dimethylformamide, N-methyl-2-pyrrolidone or N,N-dimethylacetamide, lactones such as γ-butyrolactone; or alcohols such as benzyl alcohol Such a compound can constitute the developer solvent by itself, or it can be mixed with another compound optionally belonging to the same group.

According to other optional characteristics of the process, the irradiation can be done by UV radiation, electron beam or ion implantation. When it is done by UV radiation, the dose is comprised between 300 J·cm$^{-2}$ and 1000 J·cm$^{-2}$. Irradiation by UV radiation is performed at a wavelength of 193 nm. When it is done by electron beam, the dose is comprised between 200 and 1000 μC·cm$^{-2}$. When it is done by ion implantation, the energy is comprised between 3 and 8 kev, and the dose is comprised between $3 \cdot 10^{12}$ and $2 \cdot 10^{14}$ cm$^{-2}$. More particularly, when the implanted ions are hydrogen ions, the energy is preferably 3 kev and the dose is comprised between 1 and $2 \cdot 10^{14}$ cm$^{-2}$; and when the implanted ions are oxygen ions, the energy is preferably 8 kev and the dose is comprised between $3 \cdot 10^{12}$ and $10^{13}$ cm$^{-2}$.

When the radiation dose is close to the maximum value, said group of selected solvents extends to the following compounds: ethyl acetate, dichloromethane, methyl ethyl ketone or propylene glycol monomethyl ether acetate.

When the mass fraction of polystyrene PS in the block copolymer is less than or equal to 50%, said group of selected solvents also extends to the following compounds: ethyl L-lactate or propylene glycol monomethyl ether.

When the temperature is above 25° C., said group of selected solvents extends to the following compounds: acetic acid, acetonitrile, dimethylsulfoxide, ethyl L-lactate or propylene glycol monomethyl ether.

Finally, when the temperature of the developer solvent is below 20° C., the prior radiation dose is close to the minimum value.

The invention also relates to a developer solvent used in the production of a nanolithography mask, said mask being created from a PS-b-PMMA block copolymer film, said developer solvent being able to selectively remove at least the previously irradiated PMMA blocks, said solvent being characterized in that it is chosen from a group of solvents or solvent mixtures that includes at least one compound chosen from among alcohols, such as methanol, ethanol, isopropyl alcohol, butan-1-ol, octan-1-ol, (R,S)-octan-2-ol, 4-methyl-2-pentanol, or 2-ethylhexanol.

More particularly, the developer solvent is chosen from among solvents or solvent mixtures having Hansen solubility parameters, calculated at 25° C., comprised within the following value ranges: $14.5 \leq \delta_D \leq 19.00$; $4.90 \leq \delta_P \leq 18.00$ and $5.10 \leq \delta_H \leq 15.26$.

The solvent is chosen from a group of solvents or solvent mixtures that includes at least one compound chosen from among: ketones, such as acetone or pentan-2-one; amides such as N,N-dimethylformamide, N-methyl-2-pyrrolidone or N,N-dimethylacetamide; lactones such as γ-butyrolactone or alcohols such as benzyl alcohol.

The group of solvents chosen also includes the following compounds: ethyl acetate, dichloromethane, methyl ethyl ketone, propylene glycol monomethyl ether acetate, acetic acid, acetonitrile, dimethylsulfoxide, ethyl L-lactate, or propylene glycol monomethyl ether.

When the developer solvent is made up of a mixture of solvents, this mixture is chosen at least from among one of the following mixtures: a mixture of dimethyl sulfoxide and propylene glycol monomethyl ether; a mixture of ethanol and methyl ethyl ketone; a mixture of N,N-dimethylacetamide and 4-methyl-2-pentanol; a mixture of isopropyl alcohol and dichloromethane; a mixture of dimethylsulfoxide and methanol; a mixture of dimethylsulfoxide, methanol and N,N-dimethylformamide; a mixture of acetonitrile and γ-butyrolactone; a mixture of ethyl L-lactate and N,N-dimethylformamide; a mixture of dimethylsulfoxide and N,N-dimethylformamide; a mixture of ethanol and acetone; a mixture of methyl isobutyl ketone and isopropyl alcohol or a mixture of ethanol and ethyl acetate.

The invention also relates to a nanolithography mask obtained from a PS-b-PMMA block copolymer film deposited on a surface to be etched, said copolymer film comprising PMMA nanodomains orientated perpendicularly to the surface to be etched, said mask being characterized in that it comprises at least one previously irradiated residual polystyrene PS block, said at least one residual block being obtained after treatment in a developer solvent, such as described above, of said previously and partially irradiated copolymer film.

The invention finally relates to PS-b-PMMA block copolymers intended to be used in the design of a nanolithography mask, characterized in that it has a molecular weight comprised between 5,000 g·mol$^{-1}$ and 1,000,000 g·mol$^{-1}$, and preferably comprised between 15,000 g·mol$^{-1}$ and 250,000 g·mol$^{-1}$. The mass fraction of polystyrene PS in the copolymer is comprised between 25 and 90%, and preferably between 40 and 80%.

DETAILED DESCRIPTION OF THE INVENTION

In the following description, "solvent mixture" means mixing at least two molecules of different chemical constitutions.

Figure 1:
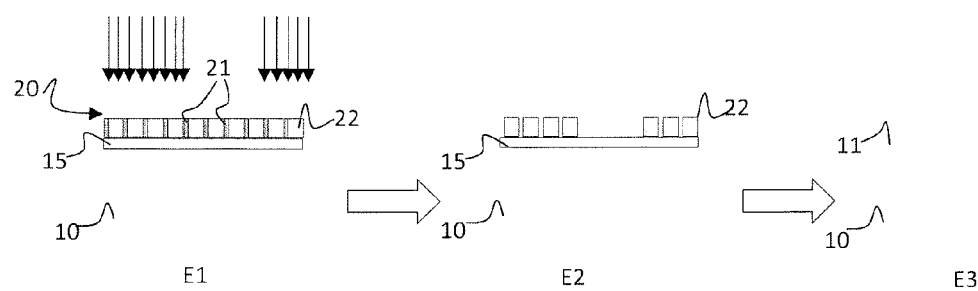
FIG. 1 is a sectional diagram of a substrate on which a nanolithography mask is created, at various steps of a nanolithography process.

FIG. 1 diagrams a sectional view of a substrate on which a nanolithography mask is created, at various steps of a nanolithography process. A first step (E1) consists of depositing on a substrate 10 or a layer to be etched, a cylindrical or lamellar PS-b-PMMA block copolymer film 20 with a morphology perpendicular to the surface to be etched. In order to create such a PS-b-PMMA block copolymer film with a phase separation between the two PS and PMMA blocks, to generate different types of patterns, such as lamellae or cylinders, orientated perpendicularly to the surface to be etched, a so-called "statistical" PS-r-PMMA copolymer is grafted onto the surface to be etched beforehand. In this statistical copolymer, styrene S monomers and methyl methacrylate MMA monomers are statistically distributed within the polymer chain. This grafted layer, called "neutralizing", designated 15 in FIG. 1, orients the PMMA cylinders or lamellae of the PS-b-PMMA block copolymer deposited on this layer perpendicularly to the surface. Without this grafted PS-r-PMMA layer, cylinders or lamellae parallel to the substrate are obtained, which are than not conducive to use as a lithography mask.

In the diagram of FIG. 1, the cylindrical or lamellar PMMA blocks, designated 21, appear darker compared to the PS blocks, designated 22. Several areas of the film are then irradiated by UV or electron beam technique or ion implantation, for example. Such irradiation is diagramed by the arrows in FIG. 1. The next step (E2), then consists of selectively removing certain areas of the film, in order to retain a porous mask in which different patterns are drawn and intended to be reproduced by etching into underlying layer or substrate 10 (E3). In the diagram, it is not only the previously irradiated PMMA blocks 21 that are removed, but also the rest of the PS-b-PMMA that was not irradiated or insufficiently irradiated. This selective removal of different areas of the film is done using a developer solvent chosen from among different solvents conforming to what is described below. The mask obtained then permits engraving substrate 10, or the underlying layer, to transfer different patterns 11 located in different areas of substrate 10 (E3).

Irradiation by UV radiation, in particular, at the wavelength of 193 nm, of the PS-b-PMMA block copolymer leads to degrading the PMMA by chain scission, thus increasing its solubility. In return, under the effect of this UV radiation, PS tends to crosslink, by creating inter-chain molecular bonds in the polymer, resulting in hardening of the polymer and thus reducing its solubility. By using an appropriate solvent, such as acetic acid, for example, it is already known to remove the irradiated PMMA and retain the rest of the film.

However, the PS-b-PMMA block copolymer film, partially irradiated, is made up of four independent chemical components according to whether or not certain areas of the film were irradiated. In fact, the chemical components are irradiated PMMA, irradiated PS, non-irradiated or insufficiently irradiated PMMA and non-irradiated or insufficiently irradiated PS. Each of these components then has its own physicochemical properties, in particular, its own solubility properties.

Depending on the physicochemical properties of the developer solvent used during the treatment following the irradiation, it is therefore theoretically possible to selectively solubilize only a single component of the film while leaving the three others intact, or selectively solubilize two or three components while leaving the other or others intact.

The solubilization physicochemical properties, also called solvating abilities, of the different solvents or solvent mixtures can be calculated according to the approach proposed by Charles Hansen in the book entitled "Hansen Solubility Parameters: A user's handbook", Second Edition (2007) Boca Raton, Fla.: CRC Press. ISBN 978-0-8493-7248-3. According to this approach, three parameters, called "Hansen parameters", $\delta_D$, $\delta_P$, $\delta_H$, are sufficient to predict the behavior of a solvent with regard to a given molecule. The parameter $\delta_D$, in $MPa^{0.5}$, quantifies the energy of the dispersion forces between the molecules, i.e., the Van der Waals forces. The parameter $\delta_P$, in $MPa^{0.5}$, represents the energy of the intermolecular dipole interactions. Finally, the parameter $\delta_H$, in $MPa^{0.5}$, quantifies the energy originating from intermolecular hydrogen bonds, i.e., the ability to interact via a hydrogen bond. The sum of the squares of the three parameters corresponds to the square of the Hildebrand ($\delta_{tot}$) solubility parameter.

Figure 3:
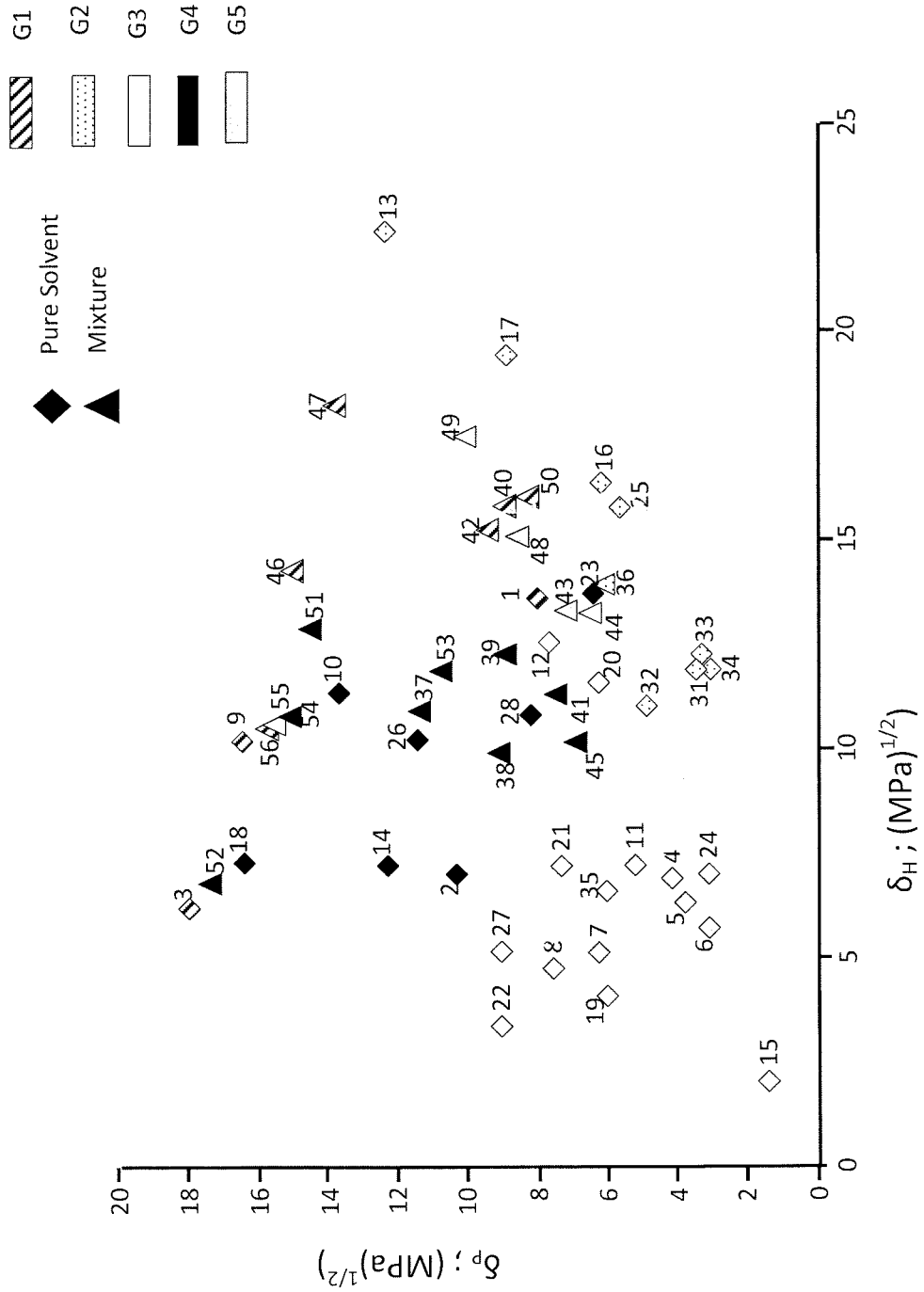
FIG. 3 is a two-dimensional graph showing the Hansen polarity parameter as a function of the Hansen hydrogen bond parameter for the different solvents studied.
Figure 4:
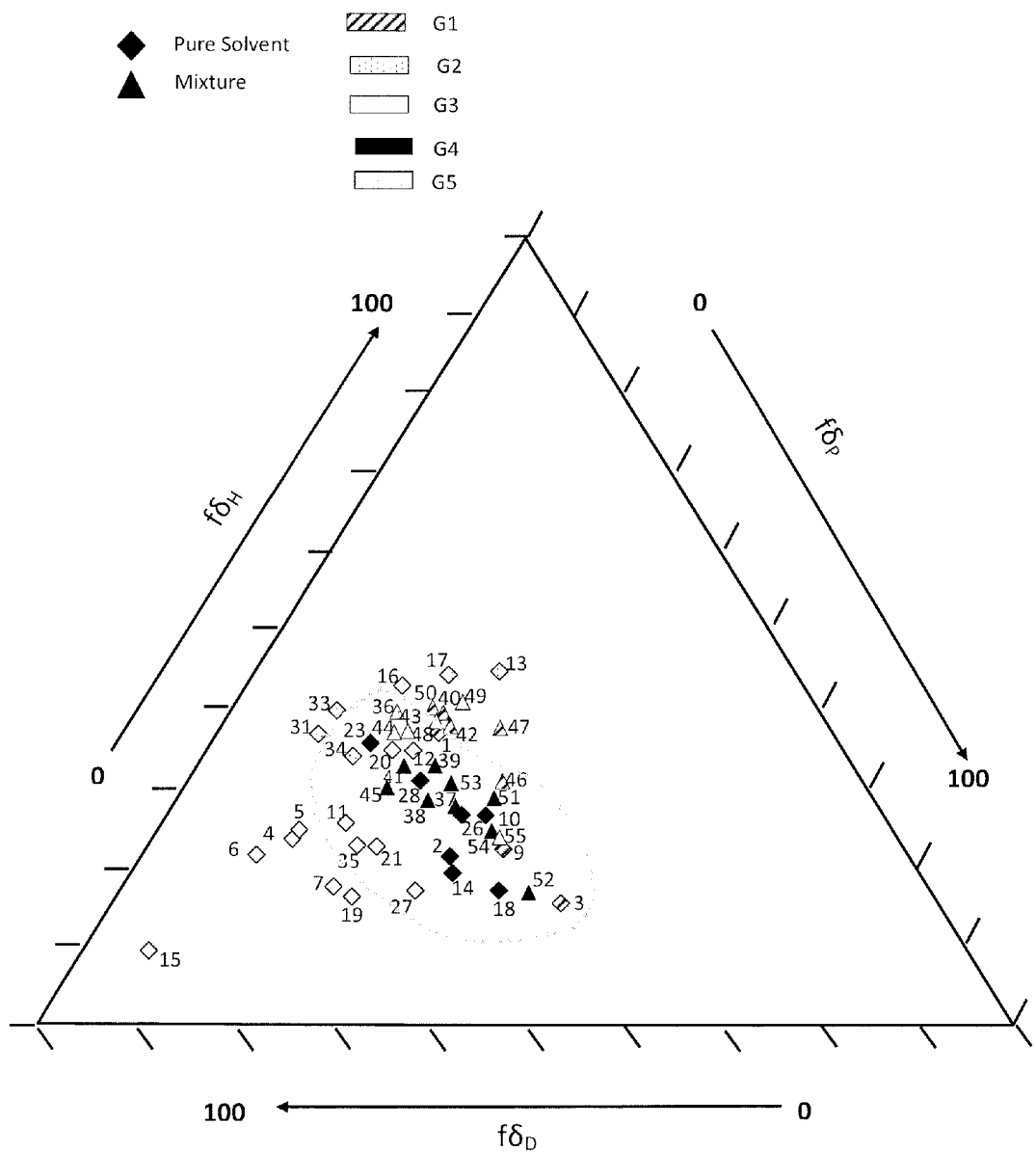
FIG. 4 is a Teas graph showing the different reduced Hansen parameters of the different solvents studied.

These three parameters $\delta_D$, $\delta_P$, $\delta_H$, specific to each solvent or solvent mixture, define coordinate points on a triangular graph known as the "Teas graph" and shown in FIG. 4, or on a conventional two dimensional graph ($\delta_P = f(\delta_H)$) in Hansen space such as shown in FIG. 3.

Note that for the Teas graph (FIG. 4), it is the reduced parameters that are plotted on the graph, i.e., the $f_{\delta D} = 100 * \delta_D / (\delta_D + \delta_P + \delta_H)$; $f_{\delta P} = 100 * \delta_P / (\delta_D + \delta_P + \delta_H)$;

$f_{\delta H}=100*\delta_H/(\delta_D+\delta_P+\delta_H)$ parameters, thus attributing, in a limiting manner, an identical value of the Hildebrand parameter for all the solvents. The representation using the conventional two-dimensional graph is limited since only two of the three parameters are used. There is therefore a need for these two additional representations to have a correct estimate of the phenomena observed.

Table I below lists solvents and solvent mixtures, and their Hansen solubility parameters calculated for a temperature equal to 25° C. Samples of a PS-b-PMMA block copolymer film, previously partially irradiated, were treated with the different solvents and solvent mixtures listed in Table I below, to understand the behavior of these different solvents and solvent mixtures on such a film. The solvents and solvent mixtures were then grouped depending on their behavior on the film. Thus, solvents of the same group will have the same effect on the copolymer film.

Generally, the polymers that can be used to generate the mask have a molecular weight comprised between 5,000 g·mol$^{-1}$ and 1,000,000 g·mol$^{-1}$, and preferably comprised between 15,000 g·mol$^{-1}$ and 250,000 g·mol$^{-1}$. Moreover, the mass fraction in polystyrene of the block is comprised between 25% and 90%, and it is preferably comprised between 40% and 80%.

The molecular weight is measured by SEC (steric exclusion chromatography) in THF (tetrahydrofuran) medium from polystyrene standards. The mass fraction is determined by $^1$H NMR (proton nuclear magnetic resonance imaging).

For the study conducted here, the PS-b-PMMA block copolymer film on which the solvents were tested in order to be grouped is a film that was synthesized by the applicant, on a native Si/SiO$_2$ substrate previously neutralized with a statistical PS-r-PMMA copolymer, to obtain a perpendicular morphology. The cylindrical PS-b-PMMA used for the film has a total molecular weight mw that is equal to 82,400 g·mol$^{-1}$. The molecular weight of PS Mn$_{PS}$ is equal to 58,400 g·mol$^{-1}$; and the PS mass fraction represents 71% of the copolymer. The inter-cylinder distance is around 36 nm. The total thickness of the polymer film before irradiation and treatment with the developer solvent is 48 nm.

The PS-b-PMMA copolymer film samples were then at least partially irradiated by ultraviolet (UV) radiation at a wavelength of 193 nm, with a dose of 500 mJ·cm$^{-2}$. The samples, including the irradiated and non-irradiated areas, were then treated with each solvent at room temperature, of around 20° C., for a duration of 5 minutes. The samples were then rinsed with deionized water and dried under nitrogen flow.

Inspecting the treated samples with a scanning electron microscope identified different solvent groups having different behaviors.

Figure 2:
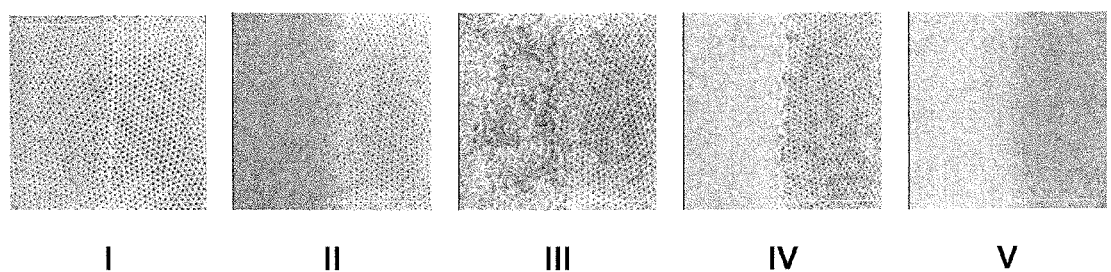
FIG. 2 shows photos taken with the scanning electron microscope, of different samples of a partially irradiated copolymer film treated with various developer solvents.

FIG. 2 shows photos of five samples treated with solvents belonging to five different groups. The left part of each photo corresponds to a portion of the sample that was not UV irradiated and the right part of each photo corresponds to a portion of the sample that was UV irradiated.

The first photo, I, represents the surface of a sample treated with a solvent belonging to a group designated as group G1 below. The photo shows a somewhat higher contrast on the right part that was irradiated than on the left part. The black spots indicate a total removal of the PMMA cylinders in the irradiated part, with strong contrast, and partial solubilization of PMMA in the left part not exposed to UV radiation. Such a solvent belonging to group G1 therefore removes previously irradiated PMMA and partially solubilizes non-irradiated PMMA.

TABLE I

| | | Hansen parameters (Mpa) | | | | Reduced parameters | | | |
|---|---|---|---|---|---|---|---|---|---|
| No. | solvent | δD | δP | δH | Σ | δD/Σ | δP/Σ | δH/Σ | G |
| 1 | acetic acid | 14.5 | 8 | 13.5 | 36 | 40.2777778 | 22.2222222 | 37.5 | 1 |
| 2 | acetone | 15.5 | 10.4 | 7 | 32.9 | 47.112462 | 31.6109422 | 21.2765957 | 4 |
| 3 | acetonitrile | 15.3 | 18 | 6.1 | 39.4 | 38.8324873 | 45.6852792 | 15.4822335 | 1 |
| 4 | anisole | 17.8 | 4.1 | 6.8 | 28.7 | 62.0209059 | 14.2857143 | 23.6933798 | 5 |
| 5 | n-butyl acetate | 15.8 | 3.7 | 6.8 | 25.8 | 61.2403101 | 14.3410853 | 24.4186047 | 5 |
| 6 | chloroform | 17.8 | 3.1 | 5.7 | 26.6 | 66.9172932 | 11.6541353 | 21.4285714 | 5 |
| 7 | cyclohexanone | 17.8 | 6.3 | 5.1 | 29.2 | 60.9589041 | 21.5753425 | 17.4657534 | 5 |
| 8 | ethyl ethyl ketone | 15.8 | 7.6 | 4.7 | 28.1 | 56.227758 | 27.0462633 | 16.7259786 | 5 |
| 9 | dimethylsulfoxide | 18.4 | 16.4 | 10.2 | 45 | 40.8888889 | 36.4444444 | 22.6666667 | 1 |
| 10 | N,N-dimethylformamide | 17.4 | 13.7 | 11.3 | 42.4 | 41.0377358 | 32.3113208 | 26.6509434 | 4 |
| 11 | ethyl acetate | 15.8 | 5.3 | 7.2 | 28.3 | 55.8303887 | 18.7292152 | 25.4416961 | 5 |
| 12 | ethyl L-lactate | 16 | 7.6 | 12.5 | 36.1 | 44.3213296 | 21.0526316 | 34.6260388 | 3 |
| 13 | methanol | 15.1 | 12.3 | 22.3 | 49.7 | 30.3822938 | 24.7484909 | 44.8692153 | 2 |
| 14 | N-methyl-2-pyrrolidone | 18 | 12.3 | 7.2 | 37.5 | 48 | 32.8 | 19.2 | 4 |
| 15 | toluene | 18 | 1.4 | 2 | 21.4 | 84.1121495 | 6.54205607 | 9.34579439 | 5 |
| 16 | isopropyl alcohol | 15.8 | 6.1 | 16.4 | 38.3 | 41.2532637 | 15.926893 | 42.8198433 | 2 |
| 17 | ethanol | 15.8 | 8.8 | 19.4 | 44 | 35.9090909 | 20 | 44.0909091 | 2 |
| 18 | γ-butyrolactone | 19 | 16.5 | 7.3 | 42.8 | 44.3925234 | 38.5514019 | 17.0560748 | 4 |
| 19 | methyl isobutyl ketone | 15.3 | 6.1 | 4.1 | 25.5 | 60 | 23.9215686 | 16.0784314 | 5 |
| 20 | propylene glycol monomethyl ether | 15.6 | 6.3 | 11.6 | 33.5 | 46.5671642 | 18.8059701 | 34.6268657 | 3 |
| 21 | dichloromethane | 17 | 7.3 | 7.1 | 31.4 | 54.1401274 | 23.2484076 | 22.611465 | 5 |
| 22 | benzonitrile | 17.4 | 9 | 3.3 | 29.7 | 58.5858586 | 30.3030303 | 11.1111111 | 5 |
| 23 | benzyl alcohol | 18.4 | 6.3 | 13.7 | 38.4 | 47.9166667 | 16.40625 | 35.6770833 | 4 |
| 24 | n-pentyl acetate | 15.3 | 3.1 | 7 | 25.4 | 60.2362205 | 12.2047244 | 27.5590551 | 5 |
| 25 | butan-1-ol | 15.8 | 5.7 | 14.5 | 36 | 43.8888889 | 15.8333333 | 40.2777778 | 2 |
| 26 | N,N-dimethylacetamide | 16.7 | 11.45 | 10.22 | 38.37 | 43.5235861 | 29.8410216 | 26.6353922 | 4 |
| 27 | methyl ethyl ketone | 16 | 9 | 5.1 | 30.1 | 53.1561462 | 29.9003322 | 16.9435216 | 5 |
| 28 | pentan-2-one | 15.8 | 8.2 | 10.8 | 34.8 | 45.4022989 | 23.5632184 | 31.0344828 | 4 |
| 31 | octan-1-ol | 17 | 3.3 | 11.9 | 32.2 | 52.7950311 | 10.2484472 | 36.9565217 | 2 |
| 32 | (R, S) octan-2-ol | 16.2 | 4.9 | 11 | 32.1 | 50.4672897 | 15.2647975 | 34.2679128 | 2 |
| 33 | 4-methyl-2-pentanol | 15.27 | 3.27 | 12.3 | 30.84 | 49.5136187 | 10.6031128 | 39.8832685 | 2 |
| 34 | 2-ethylhexanol | 15.9 | 3.27 | 11.86 | 31.03 | 51.2407348 | 10.5381888 | 38.2210764 | 2 |

TABLE I-continued

| | | Hansen parameters (Mpa) | | | | Reduced parameters | | | |
|---|---|---|---|---|---|---|---|---|---|
| No. | solvent | δD | δP | δH | Σ | δD/Σ | δP/Σ | δH/Σ | G |
| 35 | propylene glycol monomethyl ether acetate | 16.1 | 6.1 | 6.6 | 28.8 | 55.9027778 | 21.1805556 | 22.9166667 | 5 |
| 36 | Mixture 19/16 (1:4) (v:v) | 15.7 | 6.1 | 13.94 | 35.74 | 43.9283716 | 17.0677112 | 39.0039172 | 2 |
| 37 | Mixture 9/20 (1:1) (v:v) | 17 | 11.35 | 10.9 | 39.25 | 43.3121019 | 28.9171975 | 27.7707006 | 4 |
| 38 | Mixture 17/27 (1:2) (v:v) | 15.98 | 8.93 | 9.86 | 34.72 | 45.8813364 | 25.7200461 | 28.3986175 | 4 |
| 39 | Mixture 17/27 (1:1) (v:v) | 15.9 | 8.9 | 12.25 | 37.05 | 42.9149798 | 24.0215924 | 33.0634278 | 4 |
| 40 | Mixture 17/27 (3:1) (v:v) | 15.85 | 8.85 | 15.82 | 40.52 | 39.1164857 | 21.8410661 | 39.0424482 | 1 |
| 41 | Mixture 26/33 (1:1) (v:v) | 15.98 | 7.36 | 11.26 | 34.6 | 46.1849711 | 21.2716763 | 32.5433526 | 4 |
| 42 | Mixture 17/2 (2:1) (v:v) | 15.7 | 9.33 | 15.26 | 40.29 | 38.9674857 | 23.1571109 | 37.8754033 | 1 |
| 43 | Mixture 17/11 (1:1) (v:v) | 15.8 | 7.05 | 13.3 | 36.15 | 43.7067773 | 19.5020747 | 36.791148 | 5 |
| 44 | Mixture 16/21 (2:1) (v:v) | 16.2 | 6.5 | 13.3 | 36 | 45 | 18.0555556 | 36.9444444 | 3 |
| 45 | Mixture 16/21 (1:1) (v:v) | 16.6 | 6.9 | 10.2 | 33.7 | 49.2581602 | 20.4747774 | 30.2670623 | 4 |
| 46 | Mixture 9/13 (2:1) (v:v) | 17.3 | 15.03 | 14.23 | 46.56 | 37.1563574 | 32.2809278 | 30.5627148 | 1 |
| 47 | Mixture 9/13 (1:2) (v:v) | 16.2 | 13.66 | 18.26 | 48.12 | 33.6658354 | 28.3873649 | 37.9467997 | 1 |
| 48 | Mixture 28/17 (1:1) (v:v) | 15.8 | 8.5 | 15.1 | 39.4 | 40.1015228 | 21.5736041 | 38.3248731 | 5 |
| 49 | Mixture 12/13 (1:1) (v:v) | 15.55 | 9.95 | 17.4 | 42.9 | 36.2470862 | 23.1934732 | 40.5594406 | 5 |
| 50 | Mixture 12/17 (1:1) (v:v) | 15.9 | 8.2 | 15.95 | 40.05 | 39.7003745 | 20.474407 | 39.8252185 | 1 |
| 51 | Mixture ((9/13 (1:1))/10) (1:1) (v:v) | 17.35 | 14.36 | 12.76 | 44.47 | 39.0150663 | 32.2914324 | 28.6935012 | 4 |
| 52 | Mixture 3/18 (1:1) (v:v) | 17.15 | 17.25 | 6.7 | 41.1 | 41.7274939 | 41.9708029 | 16.3017032 | 4 |
| 53 | Mixture 12/10 (1:1) (v:v) | 16.7 | 10.65 | 11.9 | 39.25 | 42.5477707 | 27.133758 | 30.3184713 | 4 |
| 54 | Mixture 9/10 (1:1) (v:v) | 17.9 | 15.05 | 10.75 | 43.7 | 40.9610984 | 34.4393593 | 24.5995423 | 4 |
| 55 | Mixture 9/10 (2:1) (v:v) | 18.06 | 15.5 | 10.56 | 44.12 | 40.9338169 | 35.1314597 | 23.9347235 | 3 |
| 56 | Mixture 9/10 (3:1) (v:v) | 18.15 | 15.72 | 10.475 | 44.345 | 40.9290788 | 35.4493178 | 23.6216033 | 1 |

The second photo, II, represents the surface of a second sample treated with a solvent belonging to a group designated as group G2 below. In the photo, on the left, in the non-irradiated part, black spots are distinguished representing non-irradiated PMMA cylinders present in the PS matrix, which also remains intact. The right part of the photo, corresponding to the irradiated area, has a very high contrast, indicating the selective removal of PMMA cylinders exposed to UV radiation. Such a solvent belonging to group G2 therefore permits removing only the previously irradiated PMMA cylinders.

The third photo, III, represents the surface of a third sample treated with a solvent belonging to a group designated as group G3 below. In the left part of the photo, corresponding to the non-irradiated area of the film, an interlocked structure is observed, characteristic of a partial solubilization of the film, i.e., a partial solubilization of the non-irradiated PMMA and PS blocks. The right part of the photo, in return, corresponding to the irradiated area, has a very high contrast, indicating the selective removal of the exposed PMMA cylinders. Such a solvent belonging to group G3 therefore removes previously irradiated PMMA cylinders and partially solubilizes the rest of the non-irradiated film.

The fourth photo, IV, represents the surface of a fourth sample treated with a solvent belonging to a group designated as group G4 below. The smooth surface that appears in the left part of the photo indicates a total removal of the non-irradiated film, i.e., a total removal of the PS and PMMA blocks not exposed to UV radiation. The right part of the photo, in return, corresponding to the irradiated area, has a very high contrast, indicating the selective removal of the exposed PMMA cylinders. Such a solvent belonging to group G4 therefore permits selectively removing the previously irradiated PMMA, on the one hand, as well as the rest of the non-irradiated film, to only leave previously irradiated PS.

The fifth photo, V, represents the surface of a fifth sample treated with a solvent belonging to a group designated as group G5 below. This photo shows a smooth sample surface in both areas of the sample, irradiated and non-irradiated. Such a smooth surface is characteristic of a total removal of the film, i.e., the PS and PMMA blocks, whether or not these blocks were irradiated. Such a solvent belonging to group G5 therefore removes all the copolymer film, whether or not it was irradiated.

The different solvent or solvent mixture groups identified are then associated with different Hansen solubility parameters in Table I.

By plotting the various solvent or solvent mixture groups identified and associated with Hansen solubility parameters on the two-dimensional graph ($\delta_P = f(\delta_H)$) of FIG. 3 or on the Teas graph of FIG. 4, it is found that each of these groups, designated G1 to G5 in FIGS. 3 and 4, occupies a specific area of each graph.

For example, note that the solvents of group G5, in light gray on the graphs of FIGS. 3 and 4, are those with both a low $\delta_P$ and $\delta_H$ value, which means that they are non-polar and aprotic. Likewise, the solvents of group G2, in the dotted area on the graphs of FIGS. 3 and 4, show a moderately polar character, with a medium $\delta_P$ value and a strong protic character, with a high $\delta_H$ value. The group G1 solvents shown in the hatched area in the graphs of FIGS. 3 and 4, on the contrary, show a strong polar character, with a high $\delta_P$ value, and are moderately protic, with a medium $\delta_H$ value. These three groups constitute the "extreme" cases of the action of a given solvent on the polymer film. The solvents of groups G3 and G4, respectively shown in white and black on the graphs of FIGS. 3 and 4, occupy a central position on the graphs because they have a moderately polar and moderately protic character. They are therefore located at the junction of the previous G1, G2 and G5 groups.

The different effects observed of the solvents on the copolymer film can be explained as follows. The polystyrene fragment PS of the polymer is not very polar or protic, due to the presence of an aromatic ring and the absence of heteroatoms. It will therefore only be soluble in a type of solvent that is not very polar or protic, i.e., a solvent belonging to groups G5 and G4. The PMMA fragment is a little more polar but a little less protic due to the presence of a carbonyl/ester group. The effect of UV radiation exposure on PS tends to crosslink the PS, therefore rendering it less soluble in solvents initially considered to be good PS solvents. The effect of UV radiation exposure on PMMA tends to cleave it in the form of monomers/oligomers and therefore render it even more soluble in the polar and protic solvents of groups G1 and G2.

Since PS is the majority fragment in the polymer, the use of a good PS solvent on the film will remove all of it, even if the film was previously irradiated. This is the effect observed in the solvents of group G5.

If the solvent used is initially not a very good PS solvent, for example a moderately protic and moderately polar solvent belonging to group G4, it will become an even worse PS solvent when this PS is crosslinked after irradiation. In this case, the solvent can remove the PS not exposed to radiation, while the PS exposed to radiation remains intact. Moreover, since PMMA (whether cleaved or not) is more soluble than PS in this type of solvent, the removal of PMMA cylinders, whether previously irradiated or not, will also be enhanced by the use of this type of solvent. This is the effect observed in the solvents of group G4.

The use of poor PS solvents, i.e., polar and/or protic solvents, will also leave it intact, whether or not it is irradiated. In return, these solvents will have more impact on PMMA. Thus, the use of polar and not very protic solvents will allow removing the previously irradiated PMMA exclusively and reconstructing the surface. This is the effect observed in the solvents of group G1. The use of moderately polar and protic solvents, in return, also exclusively removes the cleaved i.e. previously irradiated, PMMA, but does not lead to surface reconstruction. This is the effect observed in the solvents of group G2.

The case of group G3 solvents can be viewed as intermediate between the effects of the solvents of group G4 and those of groups G1 and G2. A solvent of group G3 is not as good a solvent for PS not exposed to radiation to act as a solvent of group G4, and leaves a partial film on the part not exposed to radiation. But this type of solvent is too good a solvent for PS not exposed to radiation to leave the film intact like the solvents of groups G1 and G2 do. This is why the group G3 solvents actually make up a boundary between the solvents of group G4 and those of groups G1 and G2. This is perfectly illustrated by the position of solvent mixture no. 55 in the graphic representations of FIGS. 3 and 4. This mixture appears isolated on the graph compared to the other group G3 solvents while in reality it is located between a group G4 solvent and a group G1 solvent.

The solvent mixtures confirm the extent, existence and position of the different solvent groups. These solvent mixtures also offer the possibility of proposing a possible alternative to replace a pure solvent, for toxicity reasons, for example. Various mixtures, numbered 40, 42 and 50 in Table I and FIGS. 3 and 4, confirm the existence of one of the two areas of group G1 that was only suggested by the position of acetic acid, solvent no. 1, in the graphs of FIGS. 3 and 4. The position of group G3 was also confirmed by solvent mixture no. 44. Finally, several solvent mixtures, numbered 37, 38, 39, 41, 45, were successfully proposed as alternatives to the pure solvents of group G4, and defined the boundaries of this group with group G3 a little more precisely.

Overall, in the two graphic representations of FIGS. 3 and 4, it is observed that the solvents having comparable solvation properties are assembled, by group, in the same area. However, there are a few exceptions, such as benzyl alcohol, number 23, belonging to group G4. Its off-center position with regard to the area corresponding to the G4 group solvents on the graphs of FIGS. 3 and 4 can be explained in various ways, such as, for example, incorrect calculated solubility parameters, or even an underestimated additional π-π interaction between the aromatic ring of the styrene fragment and that of the benzyl, thus artificially shifting the solubility parameters of the solvent.

The solvents identified in group G4 therefore constitute very interesting solvents since, if the radiation dose is sufficient to obtain a significant chemical contrast between the different irradiated or non-irradiated PS and PMMA materials making up the PS-b-PMMA block copolymer film, they leave a porous crosslinked PS film that can be used to transfer its patterns by etching the substrate or the underlying layer.

However, the behavior of the solvents can vary depending on the operating conditions, and a solvent identified as belonging to one group when it is used at 20° C. on a sample previously irradiated with UV at a dose of 500 mJ·cm$^{-2}$, can change its behavior and belong to another group by changing at least one of the operating conditions.

Thus, the Hansen solubility parameters, calculated for a temperature of 25° C., vary with the temperature. In addition, the processes of crosslinking PS and/or cleaving PMMA are not necessarily identical, depending on the irradiation technique used. Consequently, solvents or solvent mixtures belonging to different groups can have similar behavior to solvents identified as belonging to group G4, by selectively removing previously irradiated PMMA and non-irradiated PS and PMMA. Knowing which solvents behave in the same way, even though they are identified as belonging to different groups, then extends the number of solvents or solvent mixtures that can be used depending on the operating conditions.

In order to define all the developer solvents or solvent mixtures that can selectively remove previously irradiated PMMA bocks and non-irradiated PS and PMMA blocks, it is therefore necessary to study the change in behavior of the different solvent groups according to the operating conditions.

Thus, in one variant of embodiment, an irradiation technique different from UV laser irradiation can be envisaged. In fact, it is possible to irradiate the samples by electron beams or by ion implantation, for example. These irradiation techniques, like UV radiation exposure, change the chemical constitution of the copolymer film. However, the processes of crosslinking PS and/or cleaving PMMA are not necessarily identical, depending on the irradiation technique used. Changes in the effect of the solvent treatment on the polymer after exposure can then result from this. Thus, the applicant studied several samples treated with different solvents, after irradiation by electron beam and ion implantation in order to observe any variations in solvent behavior. The applicant also studied the behavior of the solvents according to the UV radiation dose, then according to the temperature of the developer solvent used.

Example 1

Effect of the Electron Beam Irradiation Technique on Solvent Behavior

Figure 5:
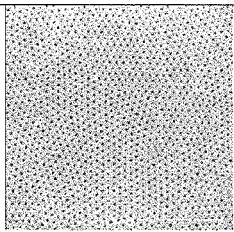
FIG. 5 shows photos taken with the scanning electron microscope, of different samples of a copolymer film irradiated by electron beam and treated with 4 solvents with different behaviors.
Figure 5:
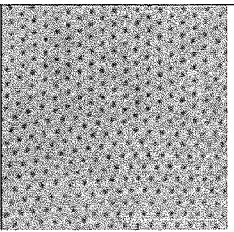
Figure 5:
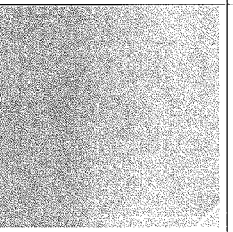
Figure 5:
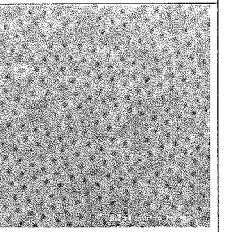

FIG. 5 collects photos, taken with the scanning electron microscope, of samples treated with solvents identified as belonging to the different groups G1, G2, G5 and G3 listed previously, following electron beam irradiation at a dose of 200 or 1000·μC cm$^{-2}$ In these photos, note that there is the same solvent behavioral tendency as that observed with UV irradiation. In fact, the same behavior is found for the solvents of groups G1 (solvent no. 1, acetic acid), group G2 (solvent no. 13, methanol) and group G3 (solvent no. 12, ethyl L-lactate) with removal of previously irradiated PMMA cylinders. Furthermore, toluene, solvent no. 15 belonging to group G5, removes the entire copolymer film, whether or not it was irradiated, as is the case with solvent no. 35 of group G5 in a sample exposed to UV, illustrated in photo V of FIG. 2.

Example 2

Effect of the Ion Implantation Irradiation Technique on Solvent Behavior

Figure 6:
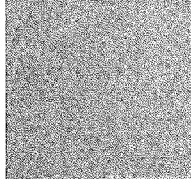
FIG. 6 shows photos taken with the scanning electron microscope, of a copolymer film irradiated by hydrogen or oxygen ion implantation and treated with 4 solvents with different behaviors.
Figure 6:
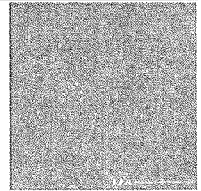
Figure 6:
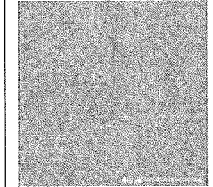
Figure 6:
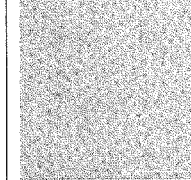
Figure 6:
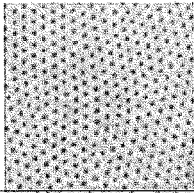
Figure 6:
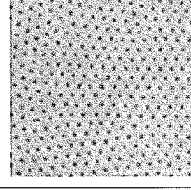
Figure 6:
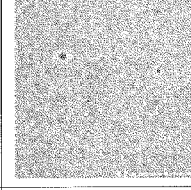
Figure 6:
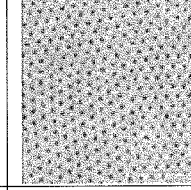
Figure 6:
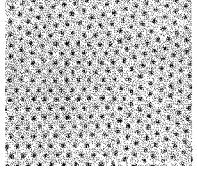
Figure 6:
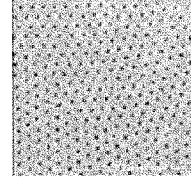
Figure 6:
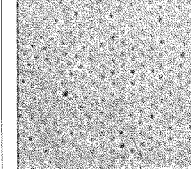

Ion implantation was studied according to the nature of the ion, the dose and the exposure energy of the polymer film. Overall, in the photos of FIG. 6, it is observed that the minimum energy dose required to change the polymer properties appears to closely depend on the nature of the ion implanted. In all the cases studied, a too-high dose/energy ratio leads to a film insensitive to treatment with the solvents studied, as illustrated in the photos of the first line of FIG. 6 (Hydrogen, E=3 kev, Dose=$2 \cdot 10^{15}$ cm$^{-2}$). When the dose/energy ratio decreases, overall the behavior of the solvents observed with UV irradiation is found. The cylinders appear empty in the images obtained by scanning electron microscopy, shown by the strong contrast, when the treatment is done with solvents of groups G1, G2 and G4. Consequently, for a hydrogen ($H_2$) ion implantation, the dose is preferably comprised between 1 and $2 \cdot 10^{14}$ cm$^{-2}$ for an energy of the order of 3 kev, while for an oxygen ($O_2$) ion implantation, the dose is preferably comprised between $3 \cdot 10^{12}$ and $2 \cdot 10^{13}$ cm$^{-2}$ for an energy of around 8 kev.

However, note that solvent no. 35 PGMEA (propylene glycol monomethyl ether acetate) of group G5 has no effect on the exposed film, while one would expect a complete removal of the film as with UV or electron beam irradiation. This can be explained by the fact that the dose/energy exposure ratio is still too high compared to the standard exposure done by UV or electron beam. Therefore, in this case, the PGMEA solvent no longer has appropriate solvation properties to solubilize either crosslinked PS or cleaved PMMA.

Example 3

Effect of the UV Radiation Exposure Dose on Solvent Behavior

The UV radiation dose to which the sample is exposed influences the degree of crosslinking of PS and the degree of cleaving of PMMA. At a low dose, the chemical contrast between the part of the film exposed to radiation and the non-exposed area will be low. As a result, the physicochemical and mechanical properties of PS and PMMA will not be very different. In return, for a higher dose, the physicochemical and mechanical properties of PS and PMMA will, on the contrary, be very highly contrasted. For reasons of energy and time savings, the lowest possible exposure dose inducing a sufficient chemical contrast is the most interesting.

Figure 7:
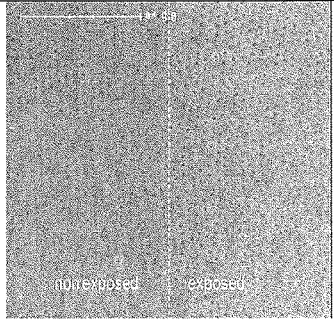
FIG. 7 shows photos taken with the scanning electron microscope of different samples of a copolymer film irradiated by UV at two different doses and treated with the same solvent.

FIG. 7 shows two photos and two samples, the left part of which has not been irradiated and the right part of which has undergone UV radiation at a wavelength of 193 nm. In the first photo, irradiation was done at a dose of 400 mJcm$^{-2}$ and in the second photo, irradiation was done at a dose of 1000 mJ cm$^{-2}$. In these photos, it is noted that at a small dose, of 400 mJ·cm$^{-2}$, there is not much contrast when the sample is treated with a group G2 solvent such as methanol (solvent no. 13), while at a higher dose, of 1000 mJ cm$^{-2}$, the contrast is obvious in the MEB image. This indicates that, when the sample is irradiated at a higher dose, of 1000 mJ cm$^{-2}$, the cylinders of the exposed area are clearly open after treatment with solvent no. 13, while the cylinders of the unexposed area, i.e., filled with PMMA, are intact and the non-irradiated PS is also intact. The solvents of group G2 are therefore better solvents of PMMA cleaved at a high dose, due to the more substantial reduction in the size of the polymer chains.

Despite the high dose required to obtain this effect, solvents of group G2 can therefore constitute an alternative to solvents of group G4. In fact, by working with selective dry etching between the blocked and open cylinders, only the irradiated cylinders can ultimately be transferred to the substrate.

Figure 8:
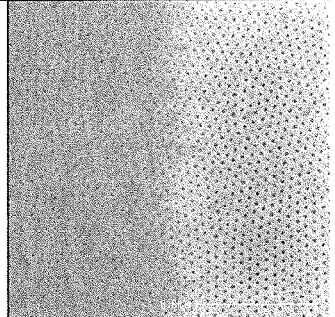
FIG. 8 shows photos taken with the scanning electron microscope of different samples of a copolymer film irradiated by UV at two different doses and treated with three different solvents that have theoretically similar behavior.

FIG. 8 shows photos of three samples partially irradiated at different doses and then treated with three different solvents identified as all belonging to group G4. In this FIG. 8, it can be observed that the minimum dose required to induce a good chemical contrast between the irradiated parts, on the right in the photos, and the non-irradiated parts, on the left in the photos, is not identical for all the solvents of group G4. In fact, if at a dose of 500 mJ·cm$^{-2}$ the effect sought is overall identical for the different solvents, at a lower dose of 300 mJ·cm$^{-2}$, the appearance of the irradiated part differs from one solvent to the other. Acetone, solvent no. 2, therefore appears to not be as good a solvent for crosslinked PS as γ-butyrolactone, solvent no. 18, or N-methyl-2 pyrrolidone, solvent no. 14. Therefore, acetone allows a somewhat lower exposure dose to keep the exposed part of the PS intact.

Figure 9:
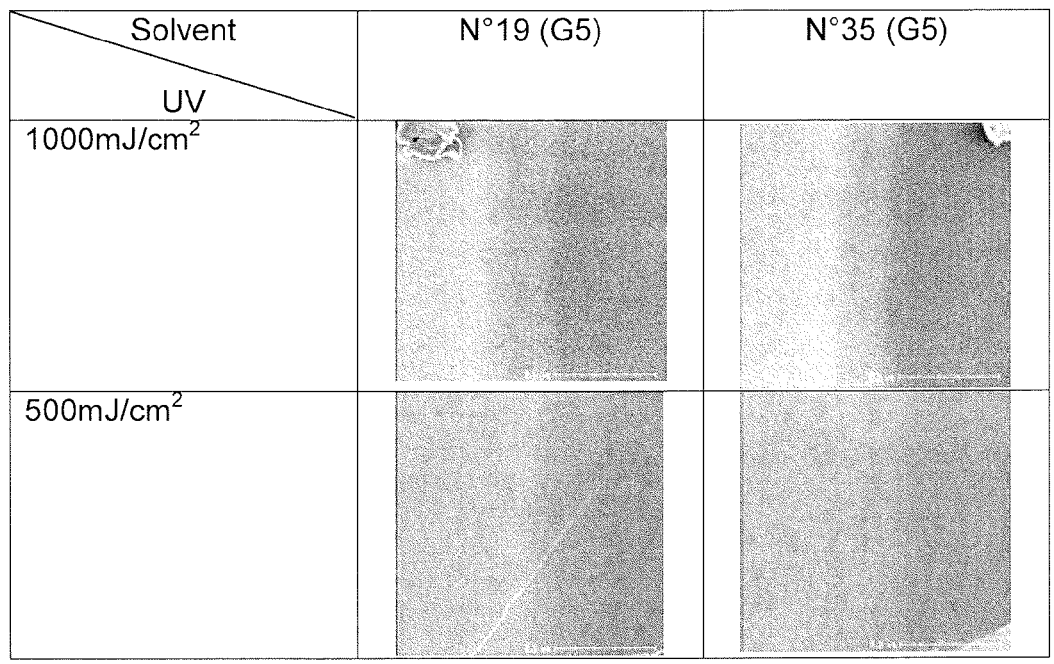
FIG. 9 shows photos taken with the scanning electron microscope of different samples of a copolymer film irradiated by UV at two different doses and treated with two different solvents that have identical behavior.

In FIG. 9, it is observed that at a conventionally used dose of 500 mJ·cm$^{-2}$, a solvent of group G5 (solvents no. 19 or 35) completely removes the copolymer film, whether or not it was irradiated. In return, a greater exposure dose, of 1000 mJ·cm$^{-2}$, renders the exposed part more resistant to group G5 solvents. In fact, in the right part of the photo, a slight contrast is observed, showing the presence of crosslinked PS. Since the extent of crosslinking of the PS matrix is more substantial with a high dose, its solubility in this type of solvent belonging to group G5 is reduced. This effect is probably greater for the G5 solvents located near the boundary with group G4, such as solvents number 11, 21, 27 or 35. The area of group G5 is consequently less extensive, to the benefit of broadening the area of group G4, when the exposure dose is increased. Even if the dose is the highest, this variant offers the possibility of broadening the range of solubility parameters belonging to group G4.

Consequently, when the radiation dose is close to the maximum value, the group of solvents or solvent mixtures also extends to the following compounds: ethyl acetate, dichloromethane, methyl ethyl ketone or propylene glycol monomethyl ether acetate.

Example 4

Effect of Solvent Temperature on its Behavior

Figure 10:
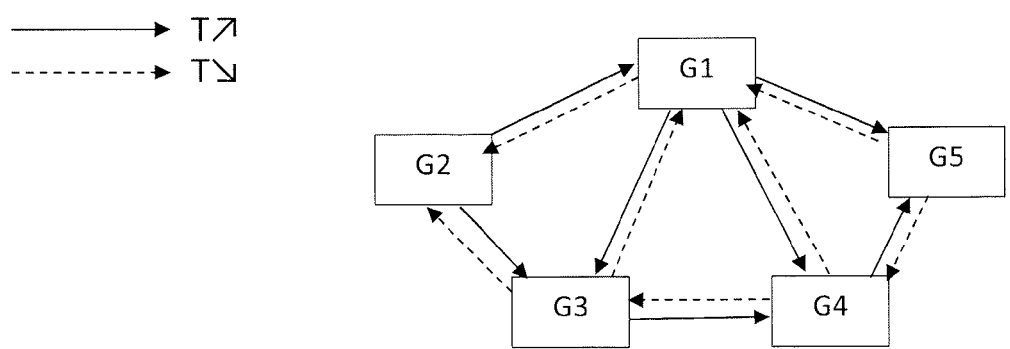
FIG. 10 is a diagram illustrating the different transitions possible between the solvent groups identified, according to temperature variations.

Generally, temperature variations for a given solvent consequently change its solvation properties. A temperature increase generally induces increased solubility of a given solute in this solvent, due to the increased entropy associated, while a temperature decrease produces the reverse effect. Given that the Hansen solubility parameters of the different solvents, which were plotted on the two graphs of FIGS. 3 and 4, were calculated for solvents at room temperature of 25° C., a variation of the solvent temperature concretely leads to a change in both the size and position of the various areas, corresponding to the different groups of solvents identified, in the graphs. More particularly, it is possible to envisage different transitions between the groups, for a given solvent, such as illustrated in the diagram of FIG. 10, depending on the initial position of the solvent in the group considered, and the temperature variation applied, i.e., the extent of heating or cooling. A solvent initially belonging to group G1 can then, for example, be found in groups G3, G4 or G5 via an increase in treatment temperature, and a group G5 solvent can, for example, be found in group G4 or group G1 via a decrease in the treatment temperature.

Figure 11:
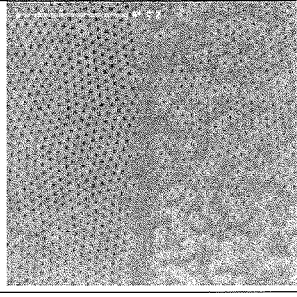
FIG. 11 shows two photos, taken with the scanning electron microscope, of a partially irradiated sample respectively treated with a solvent at room temperature and the same solvent heated to a temperature of around 40° C.
Figure 11:
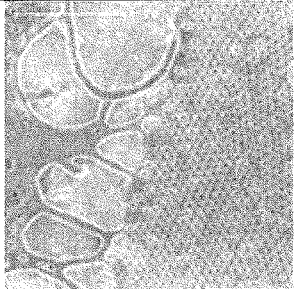

In FIG. 11, we see that this is actually the case. Indeed, the applicant was able to show that acetonitrile, solvent No. 3 belonging to group G1 at room temperature of 25° C., behaves like a solvent of group G3 by moderate heating to a temperature of around 40° C. When solvent no. 3 undergoes such heating, it can actually be seen in the photo that the left part, not irradiated, is partially solubilized, while the right part, irradiated, has empty PMMA cylinders. Such a phenomenon is characteristic of a solvent belonging to group G3.

Figure 12:
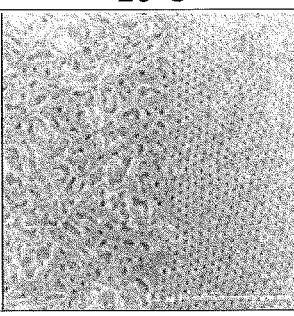
FIG. 12 shows two photos, taken with the scanning electron microscope, of another partially irradiated sample respectively treated with another solvent at room temperature and the same other solvent heated to a temperature of around 40° C.
Figure 12:
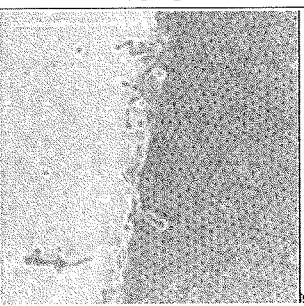

Likewise, the applicant was also able to show that propylene glycol monomethyl ether, solvent No. 20 initially belonging to group G3 at room temperature of 25° C., behaves like a solvent of group G4 by increasing the temperature to a temperature of around 60° C. (see FIG. 12). When solvent no. 20 undergoes such heating, it can actually be seen in the photo that the left part, not irradiated, is completely removed, while the right part, irradiated, has empty PMMA cylinders and intact crosslinked PS. Such a phenomenon is characteristic of a solvent belonging to group G4.

Consequently, when the developer solvent temperature is raised, during treatment of a previously irradiated sample, to a temperature greater than 25° C., the group of solvents or solvent mixtures chosen also extends to the following compounds: acetic acid, acetonitrile, dimethylsulfoxide, ethyl L-lactate or propylene glycol monomethyl ether.

Figure 13:
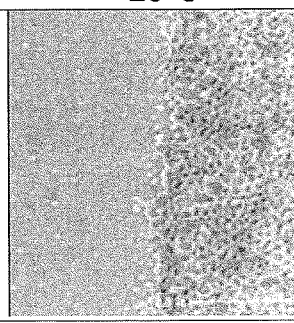
FIG. 13 shows two photos, taken with the scanning electron microscope, of another partially irradiated sample respectively treated with another solvent at room temperature and the same solvent cooled to a temperature of around 10° C.
Figure 13:
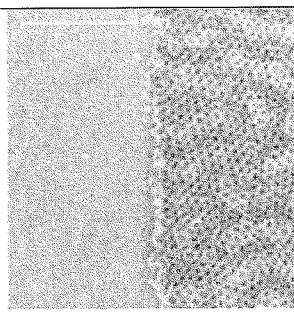

In FIG. 13, note that the structural quality of the non-irradiated part, left side of the photo, is improved if cooling is applied, for example to a temperature of 10° C., during treatment with γ-butyrolactone, solvent no. 18, belonging to group G4 at 25° C. Moreover, the solvating power of crosslinked PS, after irradiation at a minimum dose of 300 mJcm$^{-2}$, by this solvent no. 18 is reduced by cooling, thus contributing to keeping the physical integrity of PS in the exposed area, which is then less solubilized than at room temperature as illustrated in FIG. 13. This property may then be used to decrease the minimum exposure dose necessary for group G4 solvents. A lower irradiation dose thus leads to non-negligible energy savings.

Temperature variations of the developer solvent may therefore be an interesting alternative to the present invention, since a small variation can induce large changes in solvent behavior, in particular if they are located at the boundaries of the various groups at room temperature.

Example 5

Influence of the Molecular Weight of the Polymer on the Behavior of Developer Solvents The solubility of a polymer of specific chemical constitution can vary in a given solvent, when its molar mass changes, due to the variation in the entropy of the mixture associated with the degree of polymerization. Solvents located at the boundary between two particular groups may then switch from one solvent group to another if the mass of the polymer to be treated changes. For example, solvents initially belonging to group G3 with the polymer used here, of total molecular weight equal to 82,400 g mol$^{-1}$, may be considered to have the properties of those of G4 group if the molecular weight of the polymer decreases greatly. This variant therefore broadens the choice of solvents having the properties associated with group G4 in the event of a consequent variation of the molecular weight of the polymer.

Example 6

Influence of the Morphology Adopted by the Polymer on the Behavior of Developer Solvents Changing the mass fraction of the PMMA block leads to changing the morphology adopted by the block polymer. Thus, for a composition close to 50% by weight of PMMA, the copolymer adopts a lamellar morphology. However, this also changes the solubility properties of block copolymers. In fact, due to the larger portion of PMMA in the copolymer, it has an increased solubility in known "good" PMMA solvents. Consequently, a change in the mass fraction of PMMA in the copolymer leads to changing the size and position of the area corresponding to the location of the solvents of group G4 in the two-dimensional graph of FIG. 3 and in the Teas graph of FIG. 4. The choice of solvents having properties associated with group G4 solvents is therefore broadened. More concretely, given that PMMA is more soluble than PS in polar/protic solvents, it is completely predictable, for example, that solvents initially belonging to G3 (for a cylindrical polymer with PS matrix) can have the properties of those of group G4 for a lamellar block copolymer of the same molecular weight.

Consequently, when the mass fraction of polystyrene PS in the block copolymer decreases and becomes less than or equal to 50%, the group of selected solvents extends to compounds of group G3, such as, for example, ethyl L-lactate or propylene glycol monomethyl ether.

The process that has just been described, with all its different operating conditions, defines an area, illustrated by the gray dotted line in FIGS. 3 and 4, grouping solvents or solvent mixtures belonging to different identified groups but having similar properties to solvents identified as belonging to group G4 at room temperature. All the solvents and solvent mixtures located inside this area are then considered as having the same properties. Solvents at the boundary of the defined area have the same properties depending on certain operating conditions. This area is defined by the Hansen solubility parameters, calculated at 25° C. They are advantageously comprised in the following value ranges: $14.5 \leq \delta_D \leq 19.00$; $4.90 \leq \delta_P \leq 18.00$; $5.10 \leq \delta_H \leq 15.26$. This process is completely compatible with standard manufacturing methods.

The invention claimed is:
1. A method for manufacturing nanolithography masks from a PS-b-PMMA block copolymer film deposited on a surface to be etched, said block copolymer film comprising PMMA nanodomains orientated perpendicularly to the surface to be etched, wherein said method comprises the following steps:

selectively irradiating said block copolymer film to form first irradiated areas and non-irradiated areas in said block copolymer film, then treating said copolymer film in a developer solvent previously selected to selectively remove one or more nanodomains of said block copolymer film, said nanodomains being of different chemical composition, irradiated and/or non-irradiated, the selective removal consisting of removing at least said PMMA nanodomains of said irradiated areas of said block copolymer film, said developer solvent being selected from the group of solvents or solvent mixtures having Hansen solubility parameters, calculated at 25° C., within the following value ranges: $14.5 \leq \delta_D \leq 19.00$; $4.90 \leq \delta_P \leq 18.00$ and $5.10 \leq \delta_H \leq 15.26$.

2. The method according to claim 1, wherein when the treatment step consists firstly of removing nanodomains of PMMA of irradiated areas and secondly of selectively and partially removing said PMMA nanodomains of said non-irradiated areas of said block copolymer film, so as to form holes whose diameter is less than the diameter of the holes left by removing the PMMA nanodomains of said irradiated areas, the developer solvent includes at least one compound selected from the group consisting of acetic acid, acetonitrile and dimethylsulfoxide.

3. The method according to claim 1, wherein when the treatment step consists firstly of removing nanodomains of PMMA of irradiated areas and secondly of removing said non-irradiated areas of said block copolymer film, the developer solvent includes at least one compound selected from the group consisting of ketones; amides; lactones; and alcohols.

4. The method according to claim 3, wherein when the radiation dose is close to a maximum value of 1000 mJ·cm$^{-2}$, the developer solvent further includes at least one compound selected from the group consisting of ethyl acetate, dichloromethane, methyl ethyl ketone and propylene glycol monomethyl ether acetate.

5. The method according to claim 3, wherein when the mass fraction of polystyrene PS in the block copolymer is less than or equal to 50%, the developer solvent further includes at least one compound selected from the group consisting of ethyl L-lactate and propylene glycol monomethyl ether.

6. The method according to claim 3, wherein when the developer solvent temperature is above 25° C., the developer solvent further includes at least one compound selected from the group consisting of acetic acid, acetonitrile, dimethylsulfoxide, ethyl L-lactate and propylene glycol monomethyl ether.

7. The method according to claim 3, wherein the developer solvent includes at least one compound selected from the group consisting of acetone, pentan-2-one, N,N-dimethylformamide, N-methyl-2-pyrrolidone, N,N-dimethylacetamide, γ-butyrolactone, and benzyl alcohol.

8. The method according to claim 1, wherein irradiation is carried out by UV radiation at a dose comprised between 300 mJ·cm$^{-2}$ and 1000 mJ·cm$^{-2}$.

9. The method according to claim 8, wherein irradiation by UV radiation is performed at a wavelength of 193 nm.

10. The method according to claim 8, wherein when the temperature of the developer solvent is below 20° C., the UV radiation dose is close to a minimum value of 300 mJ·cm$^{-2}$.

11. The method according to claim 1, wherein irradiation is carried out by electron beam at a dose comprised between 200 and 1000 μC·cm$^{-2}$.

12. The method according to claim 1, wherein irradiation is carried out by ion implantation at an energy comprised between 3 and 8 kev, and a dose comprised between $3.10^{12}$ and $2.10^{14}$ cm$^{-2}$.

13. The method according to claim 12, wherein when the implanted ions are hydrogen ions, the energy is 3 kev and the dose is comprised between 1 and $2.10^{14}$ cm$^{-2}$; and when the implanted ions are oxygen ions, the energy is 8 kev and the dose is comprised between $3.10^{12}$ and $10^{13}$ cm$^{-2}$.

14. A developer solvent used in the method for manufacturing a nanolithography mask according to claim 1, said mask being created from a film of PS-b-PMMA block copolymer, said developer solvent being able to selectively remove at least the previously irradiated PMMA blocks, said solvent being selected depending on the nanodomains, of different chemical composition, irradiated and/or non-irradiated, to be selectively removed of said block copolymer film, and said solvent being selected from the group consisting of solvents and solvent mixtures having Hansen solubility parameters, calculated at 25° C., comprised within the following value ranges: $14.5 \leq \delta_D 19.00$; $4.90 \leq \delta_P \leq 18.00$ and $5.10 \leq \delta_H \leq 15.26$.

15. The developer solvent according to claim 14, wherein the developer solvent includes at least one compound selected from the group consisting of: ketones; amides; lactones; and alcohols.

16. The developer solvent according to claim 15, wherein the developer solvent includes at least one compound selected from the group consisting of acetone, pentan-2-one, N,N-dimethylformamide, N-methyl-2-pyrrolidone, N,N-dimethylacetamide, γ-butyrolactone, and benzyl alcohol.

17. The developer solvent according to claim 16, wherein the developer solvent further includes at least one compound selected from the group consisting of: ethyl acetate, dichloromethane, methyl ethyl ketone, propylene glycol monomethyl ether acetate, acetic acid, acetonitrile, dimethylsulfoxide, ethyl L-lactate, and propylene glycol monomethyl ether.

18. The developer solvent according to claim 14, wherein when the developer solvent is made up of a mixture of solvents, this mixture is selected from the group consisting of: a mixture of dimethyl sulfoxide and propylene glycol monomethyl ether; a mixture of ethanol and methyl ethyl ketone; a mixture of N,N-dimethylacetamide and 4-methyl-2-pentanol; a mixture of isopropyl alcohol and dichloromethane; a mixture of dimethylsulfoxide and methanol; a mixture of dimethylsulfoxide, methanol and N,N-dimethylformamide; a mixture of acetonitrile and γ-butyrolactone; a mixture of ethyl L-lactate and N,N-dimethylformamide; a mixture of dimethylsulfoxide and N,N-dimethylformamide; a mixture of ethanol and acetone; a mixture of methyl isobutyl ketone and isopropyl alcohol and a mixture of ethanol and ethyl acetate.

19. A nanolithography mask obtained from a PS-b-PMMA block copolymer film deposited on a surface to be etched, said copolymer film comprising PMMA nanodomains orientated perpendicularly to the surface to be etched, wherein said nanolithography mask comprises different irradiated and non-irradiated areas into which one or more nanodomains, of different chemical composition, have been removed, by treatment in a developer solvent according to claim 14, letting appear different patterns into said nanolithography mask.

20. A nanolithography mask according to claim 19, wherein the copolymer has a molecular weight, measured by SEC (steric exclusion chromatography) in THF (tetrahydrofuran) medium from polystyrene standards, comprised between 5,000 g·mol$^{-1}$ and 1,000,000 g·mol$^{-1}$.

21. A nanolithography mask according to claim 20, wherein the copolymer has a mass fraction of polystyrene PS which is comprised between 25 and 90%.

* * * * *